(12) United States Patent  
Rey-Mermet

(10) Patent No.: US 8,470,154 B2  
(45) Date of Patent: Jun. 25, 2013

(54) HETEROGENEOUS LIGA METHOD

(75) Inventor: Gilles Rey-Mermet, Monthey (CH)

(73) Assignee: Nivarox-FAR S.A., Le Locle (CH)

( * ) Notice: Subject to any disclaimer, the term of this patent is extended or adjusted under 35 U.S.C. 154(b) by 287 days.

(21) Appl. No.: 13/124,986

(22) PCT Filed: Oct. 7, 2009

(86) PCT No.: PCT/EP2009/063061  
§ 371 (c)(1),  
(2), (4) Date: Apr. 19, 2011

(87) PCT Pub. No.: WO2010/049246  
PCT Pub. Date: May 6, 2010

(65) Prior Publication Data  
US 2011/0203934 A1    Aug. 25, 2011

(51) Int. Cl.  
*C25D 1/00* (2006.01)  
*C25D 2/10* (2006.01)  
*C25D 5/02* (2006.01)

(52) U.S. Cl.  
USPC ............ 205/67; 205/70; 205/72; 205/118; 205/120

(58) Field of Classification Search  
USPC ............ 205/67–79, 118, 122, 123, 125, 135  
See application file for complete search history.

(56) References Cited

U.S. PATENT DOCUMENTS

| | | | |
|---|---|---|---|
| 4,058,401 A | | 11/1977 | Crivello |
| 5,718,618 A | * | 2/1998 | Guckel et al. .............. 451/41 |
| 6,458,263 B1 | * | 10/2002 | Morales et al. ............ 205/118 |
| 2007/0227893 A1 | * | 10/2007 | Saucy ........................ 205/118 |
| 2009/0081476 A1 | | 3/2009 | Saucy |

FOREIGN PATENT DOCUMENTS

| | | |
|---|---|---|
| EP | 0 567 332 A2 | 10/1993 |
| EP | 1 835 050 A1 | 9/2007 |
| EP | 1 835 339 A1 | 9/2007 |
| EP | 1 916 567 A1 | 4/2008 |

OTHER PUBLICATIONS

A. Bruno Frazier, et al., "Metallic Microstructures Fabricated Using Photosensitive Polyimide Electroplating Molds", Journal of Microelectromechanical Systems, Jun. 1993, vol. 2, No. 2.  
George A. Di Bari, "Electroforming", General Processing Data, pp. 474-490.

\* cited by examiner

*Primary Examiner* — Luan Van  
*Assistant Examiner* — Louis Rufo  
(74) *Attorney, Agent, or Firm* — Sughrue Mion, PLLC

(57) ABSTRACT

The method of fabricating metal microstructures includes the following steps:
- a) taking a substrate that has a conductive strike surface;
- b) to d) forming a first resin mould by UV photolithography, the apertures in the first resin mould revealing the conductive strike surface of the substrate;
- e) electroforming the first element by galvanic deposition of a first metal material in the apertures of the first resin mould,
- f) removing the first mould around the first element to expose the conductive strike surface of the substrate;
- g) to i) forming a new resin mould by UV photolithography, the apertures in the new resin mould revealing the first element, and the conductive strike surface of the substrate;
- j) electroforming the second element by galvanic deposition of a second metal material in the apertures of the new resin mould to form said metal microstructure;
- k) separating said metal microstructure from the substrate and from said new mould.

10 Claims, 3 Drawing Sheets

HETEROGENEOUS LIGA METHOD

CROSS REFERENCE TO RELATED APPLICATION

This is a National Phase Application in the United States of International Patent Application PCT/EP2009/063061 filed Oct. 7, 2009, which claims priority on European Patent Application No. 08167767.6 of Oct. 28, 2008. The entire disclosures of the above patent applications are hereby incorporated by reference.

FIELD OF THE INVENTION

The present invention concerns a method of fabricating metal parts by UV photolithography and galvanic deposition. The present invention concerns, more specifically, a method of this type for fabricating parts that comprise at least a first element made of a first metal, inserted into a second element made of a second metal.

BACKGROUND OF THE INVENTION

The best known methods of fabricating metal parts by UV photolithography and galvanic deposition are those based on LIGA-UV technology. Originally, LIGA (Lithographie Galvanik Abformung) technology was developed by W. Ehrfled of Karlsruhe Kernforschungszentrum (Germany) in the 1980's. It has proved very advantageous for fabricating high precision metal microstructures.

The principle of the LIGA technique consists in depositing a layer of photosensitive resin on a conductive substrate or a substrate coated with a conductive coating, carrying out X radiation via a synchrotron, through a mask that conforms to the contour of the desired microstructure; developing, i.e. removing by physical or chemical means the non-radiated portions of the photosensitive resin so as to define a mould that has the contour of the microstructure, electro-galvanically depositing a metal, typically nickel, in the photosensitive resin mould, then removing the mould to release the microstructure.

The quality of the microstructures obtained is beyond reproach, but the need to implement expensive equipment (the synchrotron) makes this technique incompatible with mass production of microstructures that must have a low unitary cost.

This is why similar methods have been developed on the basis of the LIGA method, but which use ultraviolet irradiation (UV) photosensitive resins. A method of this type is disclosed for example in the publication by A. B. Frazier et al, entitled "Metal Microstructures Fabricated Using Photosensitive Polyimide Electroplating Molds", Journal of Microelectromechanical Systems, Vol. 2, N deg. 2 June 1003. This article discloses a method of fabricating metal structures by electroplating metal in polyimide based photosensitive resin moulds. The method includes the following steps:
- creating, on a substrate, a sacrificial metal layer and a strike layer for a subsequent galvanic deposition step,
- applying a layer of photosensitive polyimide,
- UV irradiating the polyimide layer through a mask that conforms to the contour of the desired microstructure,
- developing by dissolving the non-irradiated parts of the polyimide layer so as to obtain a polyimide mould,
- electro-galvanically depositing nickel in the open part of the mould to the top of said mould,
- removing the sacrificial layer and separating the metal structure obtained from the substrate, and
- removing the polyimide mould.

The microstructures obtained in accordance with the methods of the prior art are metal microstructures made of a single metal, which is not always optimal, particularly for timepiece making applications. Indeed, it may be advantageous, for aesthetic, tribological or more generally mechanical reasons, to make bimetal microstructures comprised of at least one part made of a first metal, inserted into a part made of a second metal.

Usually, to make such bimetal microstructures, the insert (or inserts) made of a first metal is (or are) added in a traditional manner to the part made of a second metal by setting, crimping, screwing or stamping operations.

EP Patent No. 1,916,567 discloses a mixed method of fabricating parts by photolithography, adding inserts and electroforming. This method requires assembling at least two elements, one obtained by photolithography and galvanic growth, and the other by another fabrication method, and it includes the following steps:
- irradiating a photosensitive resin layer applied to a substrate through a mask;
- developing the photosensitive layer to form a polymerised resin mould;
- placing an added element obtained by another fabrication method in the polymerised resin mould;
- galvanic deposition of a metal layer from the bottom of the resin mould, such that the metal layer holds all or part of the added element;
- obtaining the part, by separating the substrate from the metal layer holding the added element and removing the polymerised resin mould.

It will be clear that at the end of the above method, the added element has already been inserted into the fabricated part. Thus, the subsequent setting, crimping, screwing or stamping operations can be omitted.

The method that has just been described has some drawbacks. Since the insert is formed by an element added from elsewhere, it has to be placed in the resin mould with a high level of precision. According to the aforementioned prior document, precise positioning of the added element is obtained via a particular configuration of the polymerised resin mould. Indeed, according to that document, the resin layer is configured such that some portions thereof can act as a guide for the added element. It will be clear that this method considerably limits the choice of shape of the microstructure being made.

It is thus an object of the present invention to provide a method for fabricating bimetal parts that include at least a first element made of a first metal, inserted into a second element made of a second metal. The method allows micrometric precision in positioning the insert, while allowing the greatest possible freedom of choice as to the shape of the microstructure.

SUMMARY OF THE INVENTION

The present invention thus concerns a method of fabricating metal parts by UV photolithography and galvanic deposition, characterized in that it includes the steps of:
a) providing a substrate that has a conductive surface,
b) coating the conductive surface with a first layer of photosensitive resin;
c) irradiating the first layer of photosensitive resin through a mask that conforms to the desired pattern cavity;
d) developing the first layer of photosensitive resin so as to form apertures therein and thus to obtain a first resin mould, the apertures in the first resin mould revealing the conductive surface of the substrate;

e) electroforming the first element by galvanic deposition of a first metal in the apertures of the first resin mould;

f) exposing the conductive surface of the substrate by removing the photosensitive resin that forms the first mould, or, alternatively, depositing a fine metal layer on the first photosensitive resin layer so as to form a new conductive surface;

g) coating the exposed conductive surfaces and the first element with a new layer of photosensitive resin;

h) irradiating the new photosensitive resin layer through a mask that conforms to the desired pattern cavity;

i) developing the new photosensitive resin layer so as to make apertures therein and therefore to obtain a new resin mould, the apertures in the new resin mould revealing the first element and the conductive surface of the substrate or the new conductive surface;

j) electroforming the second element by galvanic deposition of a second metal in the apertures of the new resin mould;

k) stripping the second element by separating it from the substrate and removing the photosensitive resin that forms the new mould.

It will be clear that with the method of the present invention, the insert is made with the same technology as the rest of the part. Thus, a first advantage of this method lies in the fact that the insert made of a first metal (in other words the first element) can be positioned relative to the second element with all the micrometric precision peculiar to the LIGA technique.

BRIEF DESCRIPTION OF THE DRAWINGS

Other features and advantages of the method according to the present invention will appear more clearly upon reading the following description, given solely by way of non-limiting example, and made with reference to the annexed drawings, in which.

DETAILED DESCRIPTION OF THE INVENTION

Figure 1:
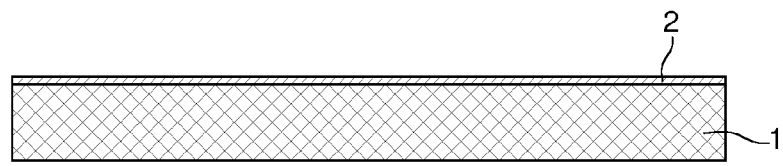
FIGS. 1 to 12 illustrate various method steps for a particular implementation of the method of the invention.

According to the present invention, the method includes the step of taking a substrate that has a conductive surface. In the particular implementation illustrated in the Figures, substrate 1 is formed by a silicon, glass, or ceramic wafer on which a conductive layer 2 (FIG. 1) has been previously deposited by vacuum plating. This conductive layer 2 is intended to act as a strike layer, i.e. a cathode, during a subsequent galvanic deposition. Typically, strike layer 2 can be formed of a sub-layer of chromium or titanium coated with a gold or copper layer.

According to a variant that is not shown, to facilitate the subsequent separation of the part from the substrate, a layer with a low degree of cohesion or adherence with the other layers is first of all deposited on the substrate. This layer, called the sacrificial layer, can easily be broken, so as to enable the multi-level metal structure to be separated from the substrate at the end of the method. The sacrificial layer can, for example, be made of aluminium by vacuum plating. The thickness of the layer may be of the order of one tenth of a micron. According to yet another variant, the same metallisation layer can fulfil both the function of sacrificial layer and that of strike layer. Moreover instead of using vacuum plating to form a sacrificial layer, it is also possible to form the layer by galvanic deposition on a first strike layer.

Alternatively, the substrate can be formed by a stainless steel or other metal plate. It will be clear that, in such conditions, it is not necessary to deposit a conductive layer. However, the strike surface must generally be cleaned before use.

Figure 2:
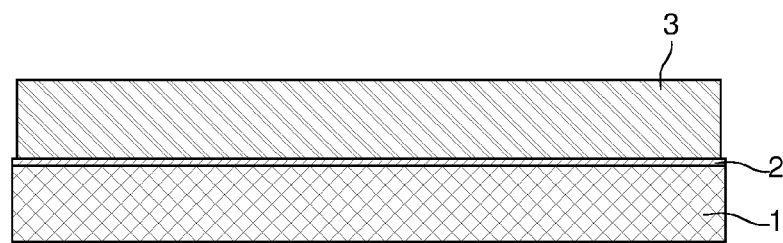

The next step (FIG. 2) consists in coating the conductive surface of the substrate with a first photosensitive resin layer 3. In this example, the resin used for this first layer is a standard positive photoresist such as Shipley S1818 or TOK C-1000. This type of photosensitive resin prepares layers than can be structured by photolithography. The thickness of these layers is typically comprised between 2 and 5 microns, and may be up to around twenty microns in the case of the C-1000.

Alternatively, one could choose SU-8, available from MicroChem Corporation. This resin forms a negative photoresist designed to polymerise under the action of UV radiation. The advantage of SU-8 is that it forms layers that can be structured by photolithography which are considerably thicker. The drawback of SU-8 is that it is more difficult to remove when the metal elements obtained via galvanic growth are stripped. A positive photosensitive resin will therefore preferably be chosen when one wishes to make inserts with a thickness of less than a few microns. Whatever happens, it is clear that the present invention is not limited to particular types of photosensitive resins. Those skilled in the art will know how to choose a photosensitive resin that fits their requirements from among all known resins suited to UV photolithography.

Resin 3 can be deposited on strike layer 2 using any technique known to those skilled in the art; for example spin coating, cylinder application, or lamination for a resin film, etc. Depending upon the thickness and technique used, the resin could be deposited in one go or several goes.

According to the particular implementation of the invention that forms the subject of this description, after step b) resin layer 3 is heated again to between 90 and 95° C., for a sufficient time for the solvents to evaporate (pre-bake). Those skilled in the art will understand, however, that depending upon the nature of the resin used, this heating step may not be necessary.

Figure 3:
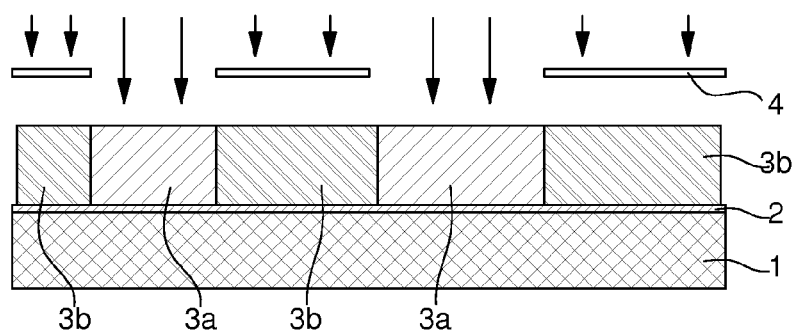

The next step of the method (FIG. 3) consists in irradiating the resin layer with UV radiation through the apertures of a mask 4 that defines the contour of the future metal insert(s). This UV irradiation may be achieved, for example, by means of a photolithography mask aligner (not shown) with peaks of intensity at 365 and 410 nm. The irradiation magnitude depends upon the thickness of the resin. It is typically between 200 and 1,000 mJ/cm$^2$ measured at a wavelength of 365 nm. A post-bake step may be necessary to complete the polymerisation induced by UV irradiation. With a positive photoresist like that used in this example, the post-bake step is preferably performed at between 90 and 95° C. for several minutes. The exposed areas 3a could subsequently be dissolved using a suitable development liquid. However, the areas 3b that are not exposed (polymerised) become insensitive to the vast majority of development liquids.

Figure 4:
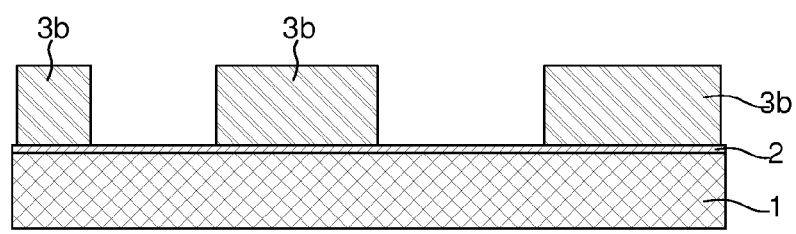

The next step of the method (FIG. 4) consists in developing the first photosensitive resin layer 3. In this example, the photoresist used is positive. In these conditions, developing the photoresist means etching it, so as to dissolve the exposed areas 3a and reveal conductive layer 2 of substrate 1. It will be clear, however, that in the case of a negative photoresist, it is the unexposed areas 3b that are dissolved. Those skilled in the art will know how to choose a suitable development liquid for the photoresist development stage on the basis of the photosensitive resin manufacturer's instructions. According to an advantageous variant, it is possible to perfect the development step by a brief plasma exposure so to clean resin mould 3b properly and activate the surface thereof in preparation for the next step. Activating the surfaces improves the strike and regularity of a galvanic deposition.

Figure 5:
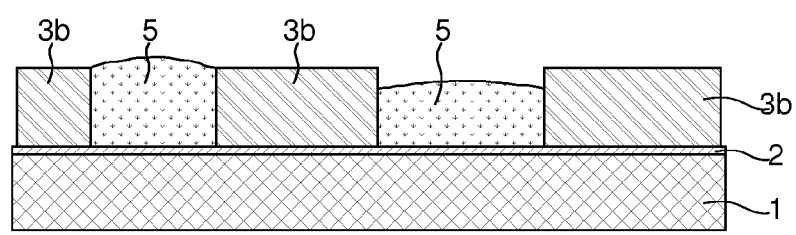

The next step of the method (FIG. 5) consists in electroforming the first element 5 (or, in other words, the insert or inserts) by galvanic deposition of a first metal in the apertures of the first resin mould 3b. In this example, the inserts are made of gold. However, those skilled in the art will understand that many other metals could be used. For inserts with a decorative function, one could cite in particular platinum, palladium, silver and rhodium. Those skilled in the art will know how to determine the conditions for galvanic deposition, in particular the bath composition, system geometry, current voltage and density, depending upon the metal or alloy to be deposited. Reference could be made, for example, to Di Bari G. A. "electroforming" Electroplating Engineering Handbook 4$^{th}$ Edition, under the direction of L. J. Durney, published by Van Nostrand Reinhold Company Inc. N.Y. USA 1984.

Figure 6:
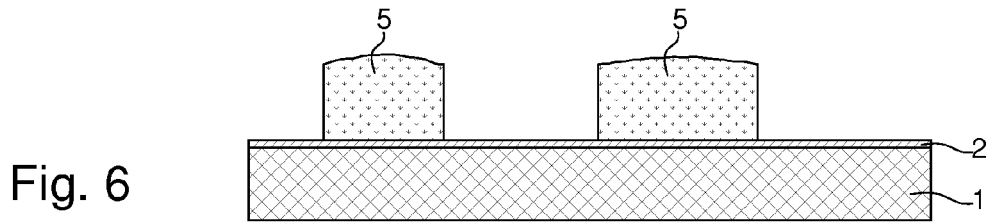

According to a first variant of the method of the present invention, the next step of the method (FIG. 6) consists in stripping the first element 5 by removing the polymerised resin forming first mould 3b. Those skilled in the art will know how to choose a suitable bath for removing resin mould 3b without etching either the metal forming electroformed elements 5, or the metal of strike layer 2. In some cases, to remove the resin completely, it may be necessary to complete or replace the use of reagents in solution by using a plasma etch. This is generally the case particularly when the mould is made of SU-8.

According to a second variant (not shown in the Figures), instead of stripping first element 5, a metal layer, called an adherence layer, is vacuum plated on the surface formed by the top of first mould 3b and element 5, which has just been formed. The function of the adherence layer is to form a new conductive strike surface for the subsequent electroforming of the second element.

Figure 7:
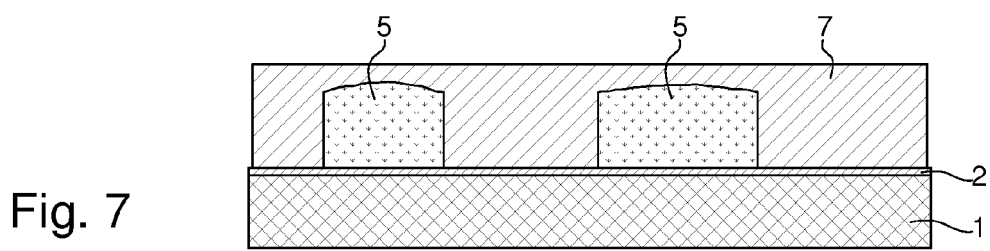

The next step of the method (FIG. 7) consists in coating conductive surface 2 and first element 5 (or alternatively coating the new conductive surface) with a new photosensitive resin layer 7. The resin used is preferably the octofunctional epoxy resin (already mentioned) available from Micro-Chem with the reference SU-8. This resin also has a photoinitiator chosen from triarylsufonium salts such as those disclosed in U.S. Pat. No. 4,058,401. This resin forms a negative photoresist, which is designed to polymerise under the action of UV radiation. Those skilled in the art will understand however that any other (positive or negative) photosensitive resin could be used instead of SU-8 without departing from the scope of the present invention.

Resin 7 can be deposited on strike layer 2 using any technique known to those skilled in the art; for example spin coating, cylinder application, or lamination if it is a film resin etc. The thickness of photosensitive resin layer 3 is typically comprised between 150 and 600 microns. Depending upon the thickness and technique used, the resin could be deposited in one go or several goes.

Figure 8:
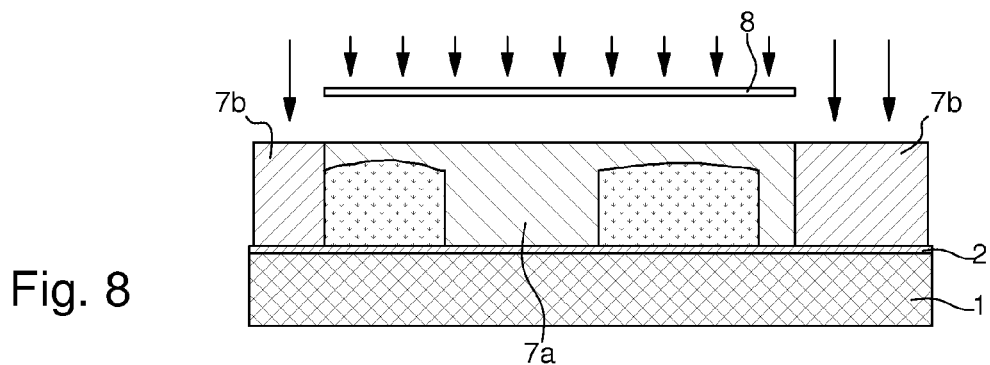

The next step of the method (FIG. 8) consists in irradiating the new photosensitive resin layer with UV radiation through a mask 8 that conforms to the desired pattern cavity. With a negative photoresist like SU-8, the unexposed areas 7a could subsequently be dissolved using a suitable development liquid. However, the exposed (polymerised) areas 7b become insensitive to the vast majority of development liquids. A post-bake step may be necessary to complete the polymerisation induced by UV irradiation. With a negative photoresist like SU-8, the post-bake step is preferably performed between 90 and 95° C. for a period of time that may be from several minutes to several hours.

Figure 9:
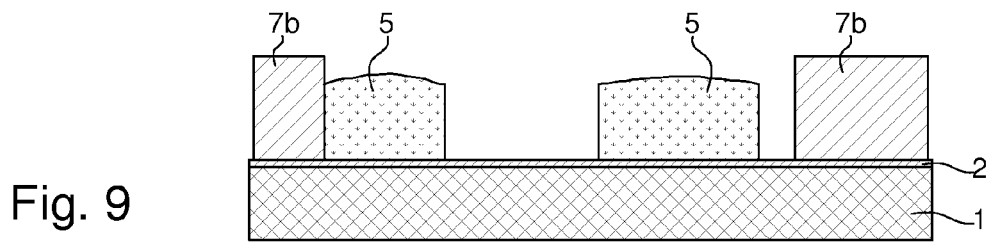

The next step of the method (FIG. 9) consists in developing the new photosensitive resin layer, i.e. in dissolving the unexposed areas thereof, so as to form a new resin mould 7b. The aperture of the new mould reveals first element 5 and conductive surface 2 of the substrate. As in step (d), it is possible to improve the development step by a brief plasma exposure so as to clean the resin mould properly and activate its surface in preparation for the following step.

Figure 10:
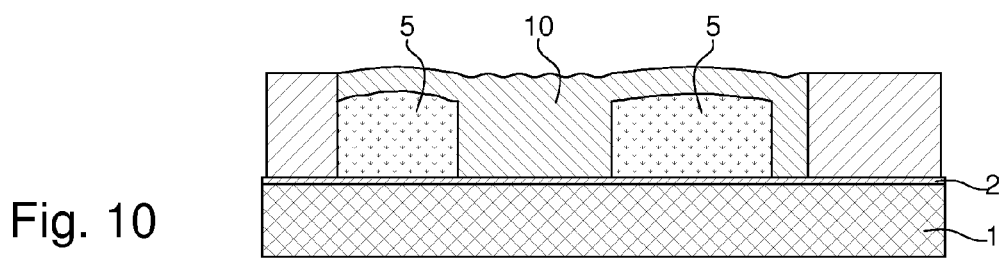

The next step of the method (FIG. 10) consists in electroforming the second element 10 by galvanic deposition of a second metal in the aperture or apertures of the new resin mould 7b. By carefully choosing the two metals used in the method, those skilled in the art may give the bimetal part the desired aesthetic or mechanical properties. In this context "metals" of course includes metal alloys. Typically, the second metal will be chosen from among the group that includes nickel, copper, gold, silver, nickel-iron and nickel-phosphorus.

Those skilled in the art will understand that the present invention is not limited to decorative applications. The function of a first element made of a first metal, which is inserted into a second element made of a second metal may also be a mechanical or tribological function. By way of example, it is possible to make metal watch hands that have an insert made of a very dense material located behind the hand. This insert is used as counterweight for the hand index. According to a particular embodiment, a nickel hand (density 8.9) could for example have a large gold insert (density 19.3) as counterweight. It should be specified that an insert to be used as counterweight would preferably be very thick (more than approximately 100 microns) so that its weight is sufficient to have the desired effect.

Once the second element 10 has been electroformed, it may be necessary to level its top face by lapping and polishing. Depending upon the solidity of the substrate, this levelling operation may occur immediately after the galvanic deposition, before the bimetal part is separated from the substrate.

Figure 11:
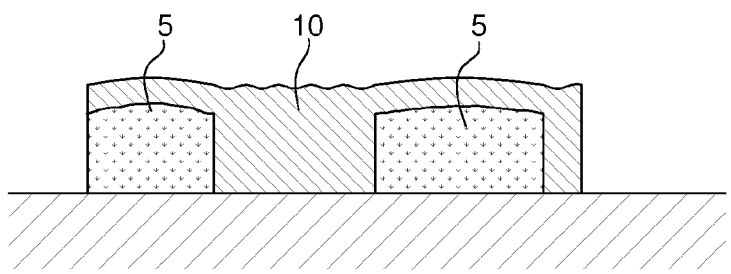

The next step of the method (FIG. 11) consists in stripping the second element by separating it from the substrate and removing the photosensitive resin that forms the new mould. According to an advantageous variant, the assembly formed by the resin mould and the bimetal part electroformed during the preceding steps is first of all detached from the substrate. However, those skilled in the art will understand that according to an alternative variant, it is possible to remove the polymerised resin forming the mould first of all, before separating the bimetal part from the substrate.

When the substrate is formed of a silicon wafer, it is possible to remove the latter by dissolving it in a potassium hydroxide (KOH) or TMAH bath. If the substrate is formed by a glass or ceramic wafer, it is not possible to dissolve the wafer. Separation of the substrate must thus occur at the sacrificial layer. Depending upon the nature of the sacrificial layer formed at the start of the method, the substrate may be separated from the bimetal part by dissolving the sacrificial layer (for example, using KOH if the layer is made of aluminium) or, conversely, without any chemical agents, simply by delaminating the sacrificial layer. Depending upon the materials used, it is also possible to omit the sacrificial layer. This is the case, in particular, when the substrate is a solid metal plate. Such a plate may, in theory, be detached from the bimetal part and the resin mould simply by delaminating.

Once the bimetal part and the resin mould have been detached from the substrate, the polymerised resin mould must also be removed to release the metal part.

Figure 12:
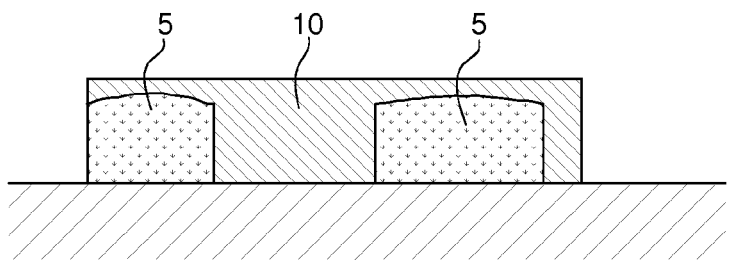

In the example forming the subject of this description, the method further includes a last step (FIG. 12), which consists in levelling the top part of the bimetal part by lapping and polishing operations.

It will also be clear that various modifications and/or improvements evident to those skilled in the art may be made to the implementation that forms the subject of this description, without departing from the scope of the present invention defined by the annexed claims. It is clear that several identical or different bimetal parts may be made at the same time on the same substrate.

The invention claimed is:

1. A fabrication method of a metal microstructure including at least a first element made of a first metal material inserted into a second element made of a second metal material, wherein the method includes the following steps:
    a) providing a substrate that has a conductive strike surface;
    b) forming a first resin mould by UV photolithography, with apertures in the first resin mould revealing the conductive strike surface of the substrate;
    c) electroforming the first element by galvanic deposition of a first metal material in the apertures of the first resin mould,
    d) removing the first mould around the first element to expose the conductive strike surface of the substrate;
    e) forming a new resin mould by UV photolithography, with apertures in the new resin mould revealing the first element, and the conductive strike surface of the substrate;
    f) electroforming the second element by galvanic deposition of a second metal material in the apertures of the new resin mould to form said metal microstructure;
    g) separating said metal microstructure from the substrate and from said new mould.

2. The fabrication method according to claim 1, wherein steps b) and e) respectively include coating the surface of the substrate with a photosensitive resin layer, irradiating the photosensitive resin layer through a mask that conforms to the desired pattern cavity and developing the photosensitive resin layer so as to make said apertures therein.

3. The fabrication method according to claim 1, wherein it includes, prior to step c) and/or step f), a plasma exposure step for cleaning and activating the surface of the resin present on the substrate.

4. The fabrication method according to claim 1, wherein it includes, after step f), a step h) a step of levelling the metal microstructure.

5. The fabrication method according to claim 1, wherein it includes, after step g), a step h) a step of levelling the metal microstructure.

6. The fabrication method according to claim 1, wherein the substrate also includes a sacrificial layer for facilitating step g).

7. The fabrication method according to claim 1, wherein the substrate is formed by silicon, glass or ceramic material.

8. The fabrication method according to claim 7, wherein the conductive strike surface is formed of a stack of chromium and gold layers.

9. The fabrication method according to claim 1, wherein the substrate is formed by a stainless steel or metal forming said conductive strike surface.

10. The fabrication method according to claim 1, wherein several microstructures are fabricated at the same time on the same substrate.

* * * * *